United States Patent [19]

Scannell

[11] Patent Number: 5,010,446
[45] Date of Patent: Apr. 23, 1991

[54] MULTI-EDGE EXTENDER BOARD

[75] Inventor: Michael B. Scannell, Chicago, Ill.

[73] Assignee: Commonwealth Edison Company, Chicago, Ill.

[21] Appl. No.: 428,917

[22] Filed: Oct. 30, 1989

[51] Int. Cl.[5] .............................................. G01R 31/22
[52] U.S. Cl. ..................................... 361/398; 439/59; 361/399; 361/413; 324/158 F
[58] Field of Search .............. 361/388, 390, 398, 408, 361/410, 412, 413, 414, 416; 174/250, 253, 254, 255, 261; 439/45, 47, 48, 49, 52, 59, 60, 61, 62, 65, 638

[56] References Cited

U.S. PATENT DOCUMENTS

| | | | |
|---|---|---|---|
| 2,951,185 | 8/1960 | Buck | 439/59 |
| 3,605,061 | 9/1971 | Martin | 439/61 |
| 3,993,936 | 11/1976 | Meade et al. | 439/59 |
| 4,162,818 | 7/1979 | Martin | 439/61 |
| 4,230,986 | 10/1980 | Deaver et al. | 324/158 F |
| 4,465,972 | 8/1984 | Sokolich | 324/158 F |
| 4,490,775 | 12/1984 | Quan | 361/400 |
| 4,516,072 | 5/1985 | Marpoe, Jr. | 324/158 F |
| 4,816,751 | 3/1989 | Seiichi et al. | 324/158 F |

Primary Examiner—Leo P. Picard
Assistant Examiner—Donald A. Sparks
Attorney, Agent, or Firm—Emrich & Dithmar

[57] ABSTRACT

A planar generally rectangular, multi-edge extender board has a plurality of spaced terminals along adjacent edges thereof or along three or four of its edges. Each of the edge terminals is coupled by means of a conductor to either a terminal on an opposed edge of the extender board or to a multi-pin connector mounted to an inner portion of the extender board. The edge terminals of the extender board are adapted for insertion in and coupling to either a connector in an equipment rack in which the circuit board is used or direct coupling to the circuit board itself. The multi-pin connector allows the edge-mounted terminals of the extender board to be coupled via a multi-conductor ribbon cable to corresponding edge terminals of a circuit board removed from the equipment rack. The extender board allows for complete testing of a thus removed circuit board having terminals on two or more adjacent edges as well as on both sides thereof without modifying either the circuit board or the equipment rack in which it is installed. Following circuit board testing, the extender board is removed from the equipment rack permitting re-installation of the circuit board into its in-service position. An arrangement for securely supporting the circuit board when electrically coupled to the extender board is also provided.

34 Claims, 3 Drawing Sheets

MULTI-EDGE EXTENDER BOARD

BACKGROUND OF THE INVENTION

This invention relates generally to the testing and/or servicing of circuit boards, and is particularly directed to an extender board arrangement for allowing testing/troubleshooting of a circuit board while electrically connected, yet physically removed from its in-service position.

Circuit boards are frequently installed in an equipment rack, wherein a plurality of such circuit boards are maintained in a parallel, closely spaced arrangement. The leading edge of the circuit board as it is installed in the equipment rack is typically provided with a plurality of spaced terminals or contacts for insertion in and electrical coupling to a fixed connector in the equipment rack. Adjacent edges of the circuit board may also be provided with spaced terminals, or contacts, along the length thereof for electrical coupling to other connectors within the equipment rack. The circuit board may take on various forms, with the printed circuit (PC) and wired circuit boards being two of the more common types of circuit boards. The former generally includes etched or plated circuits on a substrate, while the latter includes insulated wires attached to the substrate in a predetermined pattern. The substrate, generally in the form of a planar sheet, generally provides mechanical support and electrical insulation, but also sometimes performs a useful electrical function.

Sometimes it is necessary to test or service a circuit board by removing it from the equipment rack and coupling it to the circuitry therein by means of an extender board, or card. The extender board is typically inserted in the connectors in which the circuit board is installed and provides electrical leads to its outer edge to which the circuit board is connected for testing/troubleshooting. The extender board thus provides a plurality of conductive paths between the fixed connector mounted in the equipment rack and the leading edge of the circuit board following its removal from the equipment rack. The removed circuit board is thus coupled to the circuitry with which it operates in the equipment rack, while removed from the equipment rack, to allow for replacement and/or repair of circuit elements on the circuit board. An example of such an extender board for coupling leading edge terminals on a circuit board to a connector in an equipment rack following removal of the circuit board from the equipment rack can be found in U.S. Pat. No. 2,951,185 to Buck.

Extender boards of the type discussed above provide an electrical connection to and limited support for the circuit board during testing. The circuit board is first removed from its installed position and the extender board is inserted in the same position in place of the circuit board. Inner and outer edges of the extender board are provided with a plurality of spaced terminals or an elongated connector to permit the extender board to be electrically coupled to circuitry in the equipment rack on its inner edge and to the removed circuit board on its outer edge.

Another type of circuit board has terminals on both its front and back edges. This type of circuit board is mounted in a cabinet with the terminals on its rear edge connecting to the contact elements in the inside of the cabinet, with its front edge terminals inserted into a flexible type connector which is electrically connected to appropriate contact elements in the cabinet. In-service testing is performed with the previously described extender board used with single edge boards. The back edge of the circuit board is inserted into the front edge connector of the extender board, while the terminals on the back edge connector of the extender board are connected to contact elements in the cabinet. The front edge of the circuit board is connected to the existing flexible connector, if that connector is long enough, or an extension connector is used to reach terminals on the circuit board's front edge.

With the increasing use of circuit boards having contacts on two or more adjacent edges, "in place" testing of the circuit board has become increasingly difficult. Such testing/troubleshooting of circuit boards has been further complicated by the closer spacing of adjacent circuit boards brought about by more restrictive space constraints as well as by the use of dual sided and multi-layered circuit boards. Testing of these latter types of circuit board generally requires a separate test module for providing selective inputs to the circuit board and reading designated outputs therefrom. In addition, during testing of the removed circuit board it is attached to the extender board generally by electrical connections only and is thus only loosely supported in an unstable manner.

The present invention eliminates the need for such complicated and expensive circuit board test equipment by allowing the testing of dual sided circuit boards having terminals on two or more adjacent edges in their operating environment. The present invention contemplates the use of an extender board which is inserted in the in-service position of the circuit board and provides conductive paths to each of the multiple edge positioned terminals of the circuit board after removal from its equipment rack and attachment and electrical coupling to the extender board.

OBJECTS AND SUMMARY OF THE INVENTION

Accordingly, it is an object of the present invention to provide testing and servicing of a circuit board removed from its in-service position.

Another object of the present invention is to provide testing for a circuit board removed from its operating position by directly coupling the circuit board to circuitry with which it interfaces during operation without modifying the interfacing circuitry or employing a separate tester.

Still another object of the present invention is to provide a testing and servicing arrangement for use with virtually any type of circuit board having contacts on two or more adjacent edges of the board.

A further object of the present invention is to provide an extender board for use in testing, servicing or replacing a circuit board having a plurality of spaced terminals or contacts on two or more of its adjacent edges without modifying either the circuit board or the equipment in which it is installed.

A still further object of the present invention is to provide an arrangement for quickly and easily testing and servicing a circuit board having spaced electrical terminals on at least two adjacent edges or on all of its edges.

This invention contemplates apparatus for use with a circuit board having first and second adjacent edges with first and second terminal means respectively disposed thereon for coupling the circuit board to circuitry in a support structure in which the circuit board is mounted, wherein the apparatus couples the circuit board to the circuitry with the circuit board removed from the support structure, the apparatus comprising: a generally planar, rigid substrate having a plurality of edges; third and fourth terminal means disposed on respective opposed first and second edges of the substrate, wherein the third and fourth terminal means are electrically coupled by conductive means and wherein the third terminal means is coupled to the circuitry in the support structure and the fourth terminal means is coupled to the first terminal means of the circuit board; fifth and sixth terminal means respectively disposed on a third edge and on an inner portion of the substrate, wherein the third edge is disposed adjacent to the first edge of the substrate and the fifth and sixth terminal means are electrically coupled; and means for coupling the sixth terminal to the second terminal means on the circuit board.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
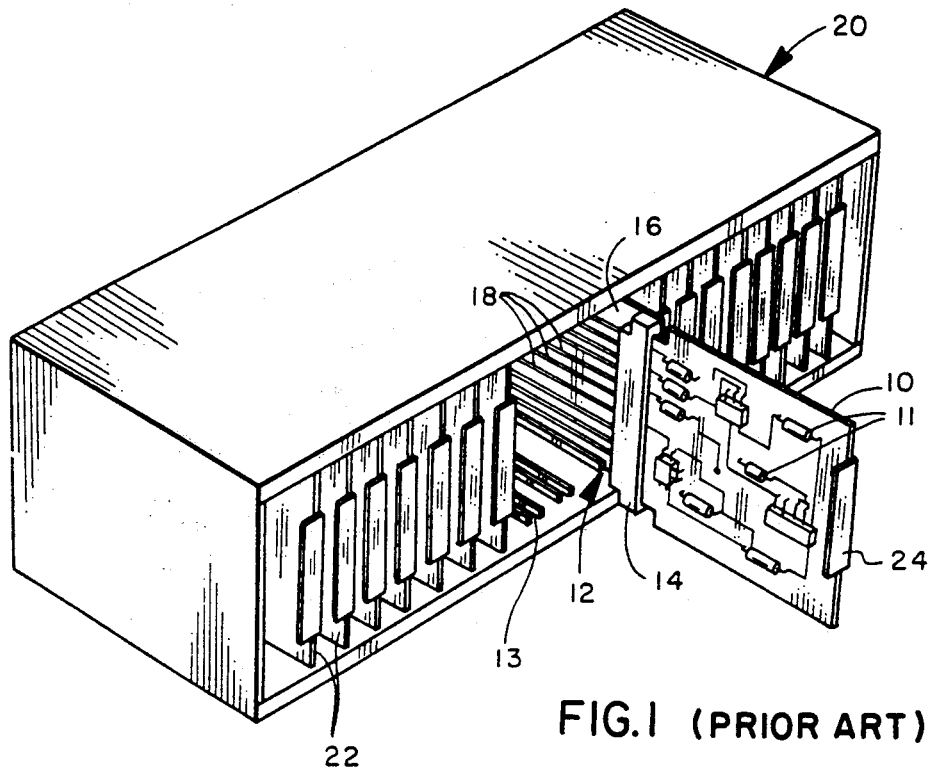
FIG. 1 is a perspective view of a prior art extender board arrangement for testing and servicing a circuit board removed from the equipment rack in which it operates.

Referring to FIG. 1, there is shown a perspective view of an equipment rack 20 containing a plurality of spaced circuit boards 22 with which the extender board of the present invention is intended for use. Each of the circuit boards 22 is adapted for sliding insertion into the equipment rack 20 by means of upper and lower rails 13 within the equipment rack which provide support for and proper alignment between adjacent circuit boards. An inner portion of the equipment rack 20 includes a plurality of spaced, generally vertically aligned, elongated linear connectors (not shown in the figure for simplicity), which are adapted for receiving a leading edge of a circuit board 22 for electrically coupling the circuit board to other circuitry within the equipment rack. The aforementioned upper and lower support rails 13 may also be provided with suitable edge terminal connectors for electrically coupling terminals located on the upper and lower edges of a circuit board 22 to other circuitry within the equipment rack 20. In some cases, even the outer, or trailing, edge of a circuit board 22 may be provided with a number of terminals for electrical coupling to other circuitry within the equipment rack 20.

A circuit board 10 is shown removed from the equipment rack 20 and electrically coupled thereto by means of a prior art combination of an extender board 12 and connector 14. Though not shown in the figure, the circuit board 10 includes a plurality of spaced terminals on its inner edge which are coupled by means of connector 14 to extender board edge terminals and thence to respective elongated, linear conductors 18 on the extender board 12. The prior art extender board 12 includes a plurality of such elongated, linear conductors 18 which connect respective pairs of terminals on the inner and outer facing edges of the extender board. The extender board 12 is comprised of a substrate 16 upon which are disposed and to which are bonded the aforementioned spaced conductors, or leads, 18. An outer edge of the circuit board 10 is provided with a gripping bracket 24 to facilitate insertion and removal of the circuit board from the equipment rack 20 without damaging circuitry on the circuit board or causing injury to one servicing the circuit board.

Figure 2:
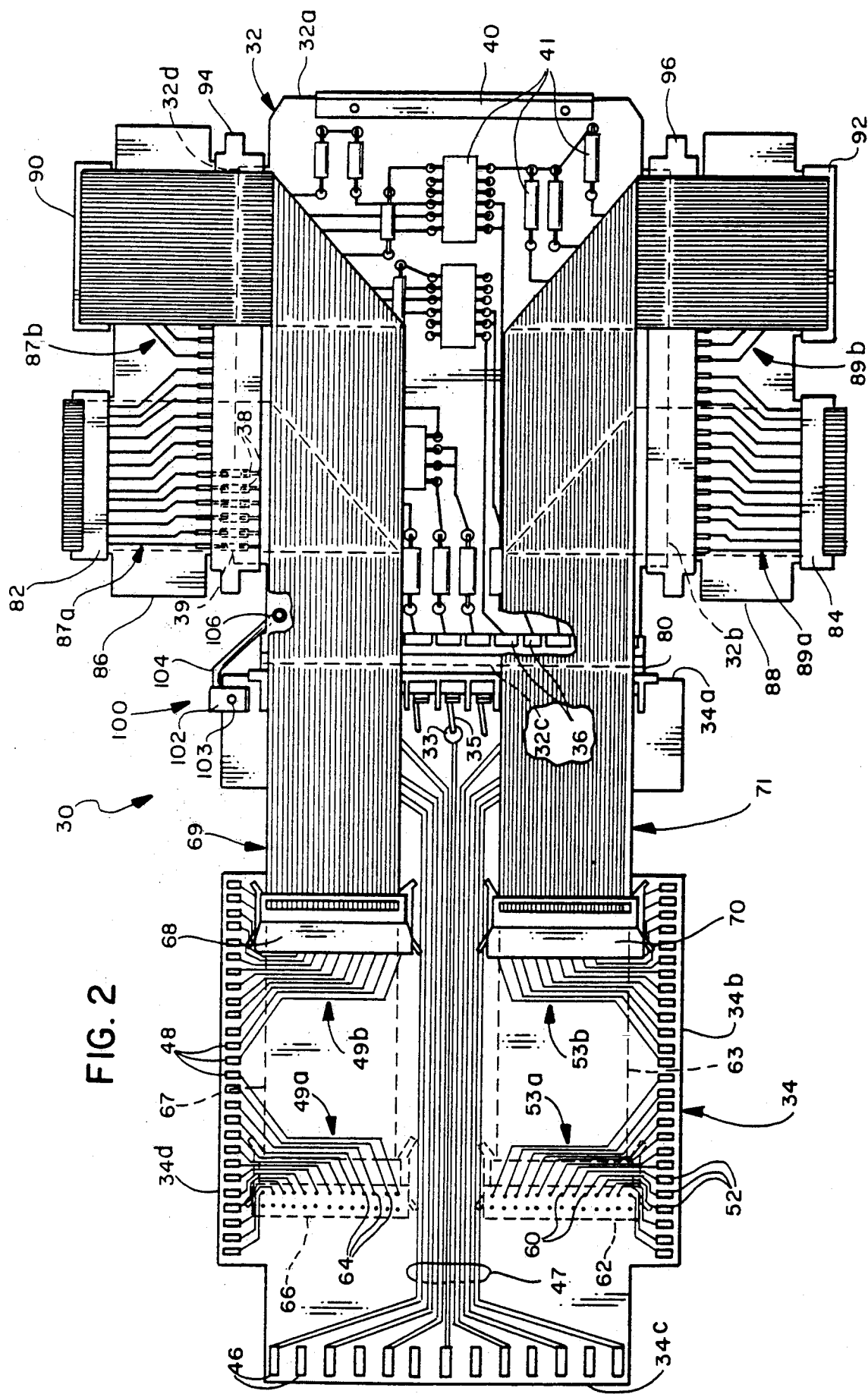
FIG. 2 is a plan view shown partially in phantom of an extender board in accordance with the present invention illustrating the manner in which the various edge terminals of the extender board are coupled to associated edge terminals on the circuit board being tested.

Referring to FIG. 2, there is shown partially in phantom a plan view of an extender board arrangement 30 in accordance with the present invention. The inventive extender board arrangement 30 includes an extender board 34 adapted for insertion in and electrical coupling to the aforementioned equipment rack as well as to a circuit board 32. Top and bottom planar views of the extender board 34 are respectively shown in FIGS. 4 and 5. Disposed on the circuit board 32 are a plurality of electronic components 41 electrically coupled to edge terminals by means of various conductive strips or wires on the circuit board. The circuit board 32 includes first, second, third and fourth peripheral edges 32a, 32b, 32c and 32d which may each be provided with a plurality of spaced terminals as is shown by the terminals 38 in the upper edge 32d of the circuit board. The circuit board 32 may include similar electronic circuitry on its opposed surface also having associated edge terminals (not shown). A gripping bracket 40 is disposed on edge 32a of the circuit board 32 to facilitate grasping of the circuit board for insertion in or removal from an equipment rack or other circuit installation.

The extender board 34 also includes a plurality of edge portions 34a, 34b, 34c and 34d. Each of the aforementioned extender board edges has disposed adjacent thereto a respective plurality of terminals. Thus, terminals 52 are positioned adjacent to extender board edge 34b, terminals 46 are positioned adjacent to edge 34c, and terminals 48 are positioned adjacent to edge 34d. A plurality of spaced terminals 33 are also disposed adjacent to edge 34a and are each connected via a respective wire lead 35 to a connector 80 disposed on that edge of the extender board 34.

Also positioned on the extender board 34 are a plurality of spaced, elongated conductors 47 in a printed circuit pattern, although these conductors may take on various forms such as insulated wires. Each of the conductors 47 couples one of terminals 46 on extender board edge 34c to a respective terminal 33, adjacent to extender board edge 34a. Each of the terminals 33 is coupled by means of respective wires 35 to corresponding terminals on the connector 80 for coupling the extender board 34 to the circuit board 32 as described below.

Some of the terminals 52 on extender board edge 34b are coupled by means of a first plurality of conductors 53a to terminal pins 60 on an inner portion of the extender board 34. Similarly, others of the terminals 52 are coupled to corresponding terminal pins (not shown in FIG. 2) by means of a second plurality of conductors 53b. On the opposing edge 34d of extender board 34, some of the terminals 48 are coupled by means of a third plurality of conductors 49a to another set of terminal pins 64, while others of the edge terminals are coupled via a fourth set of conductors 49b to still another plurality of terminal pins, which are not shown in FIG. 2 for simplicity. Adjacent sets of terminal pins on the extender board 34 extend from opposing sides thereof. Thus, terminal pins 60 extend into the plane of the extender board 34 shown in FIG. 2, while terminal pins coupled to conductors 53b extend upward from the extender board. Similarly, terminal pins 64 extend into the plane of the extender board 34 as shown in FIG. 2, while those terminal pins coupled to conductors 49b extend upward out of the plane of FIG. 2. Connectors 62 and 64, shown in FIG. 2 in dotted line form because they are positioned on the other side of the extender board 34, are respectively coupled to terminal pins 60 and 64. Similarly, connectors 68 and 70 are respectively coupled to the terminal pins coupled to the ends of conductors 49b and 53b. Each of the aforementioned connectors is coupled by means of a multi-conductor flexible ribbon cable to respective sets of terminal pins on the circuit board 32. Thus, connector 62 is coupled to terminal pins on edge 32b of circuit board 32 via the combination of ribbon cable 63, a connector 84, an interconnect card 88, also sometimes referred to as an adapter card, and another connector 96. The terminals pins coupled to connector 70 are similarly coupled to adjacent terminals on edge 32b of the circuit board 32 via the combination of ribbon cable 71, connector 92, interconnect card 88, and connector 96. Similarly, terminal pins 64 are coupled to edge terminals 39 on edge 32d of the circuit board 32 via the combination of connector 66, ribbon cable 67, connector 82, interconnect card 86, and connector 94. The extender board's terminal pins coupled to conductors 49b are similarly coupled to other terminals on edge 32d of circuit board 32 via the combination of connector 68, ribbon cable 69, connector 90, interconnect board 86, and connector 94. The various aforementioned connectors are of the universal ejection type pin header assembly in a preferred embodiment.

As indicated above, the terminals 46 on edge 34c of the extender board 34 are coupled via respective ones of the plurality of conductors 47 to terminals 33 adjacent to an opposing edge 34a of the extender board. Each of the terminals 33 is coupled via a respective wire lead 35 to the corresponding terminal in an edge connector 80. The edge connector 80 is adapted to receive a plurality of terminals 36 on an edge 32c of the circuit board 32 for electrical coupling thereto. As shown in the figure, the terminals 33 may be positioned on either, or both, surfaces of the extender board 34, with each of these terminals coupled via a respective wire to an associated terminal within the edge connector 80. In this manner, the extender board 34 may be inserted into an equipment rack and electrical signals provided to terminals 46 adjacent to its edge 34c may be provided to terminals 36 adjacent to circuit board edge 34a via conductors 47 and connector 80.

Figure 4:
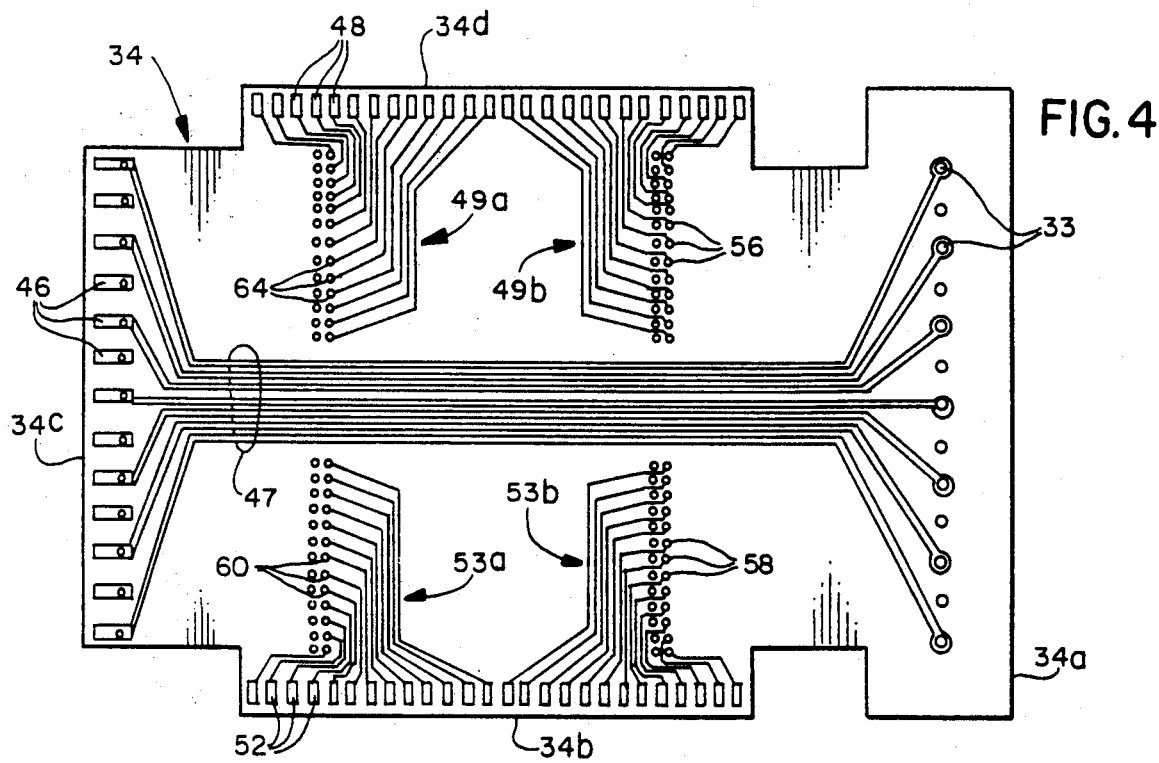
FIGS. 4 and 5 are planar views of first and second sides, respectively, of the multi-edge extender board of the present invention.
Figure 5:
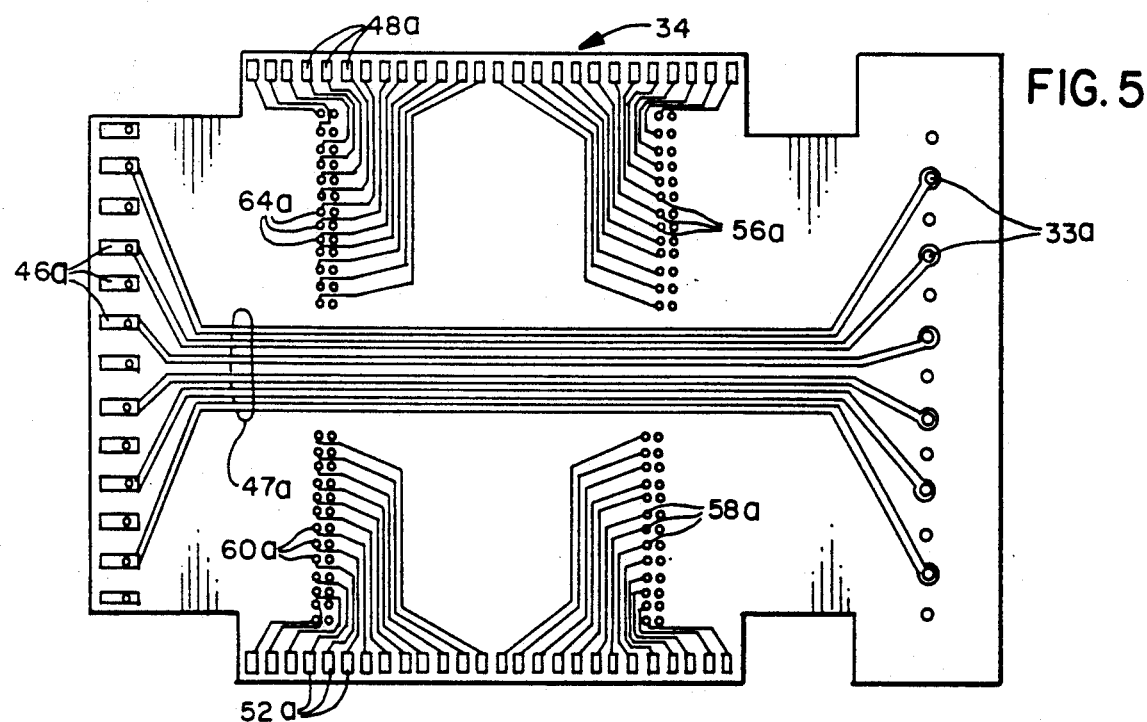

It should be noted here that while the terminals 33 are shown in FIG. 4 as being of the plated through hole type, they could as easily be terminals such as shown on the other edges of the extender board 34. It should also be noted here that each of the respective pluralities of conductors 49a, 49b, 53a and 53b are coupled to the right-hand terminal pins in the arrayed pairs of terminal pins within the extender board 34 as shown in FIG. 4. As shown in FIG. 5, corresponding conductors are coupled to the left-hand terminal pins 64a, 56a, 60a, and 58a in the extender board 34. The lower surface of the extender board 34 as shown in FIG. 5 is provided with edge terminals 33a, 48a, 46a and 52a corresponding to those terminals on the opposing surface of the extender board and illustrated in FIG. 4.

Figure 3:
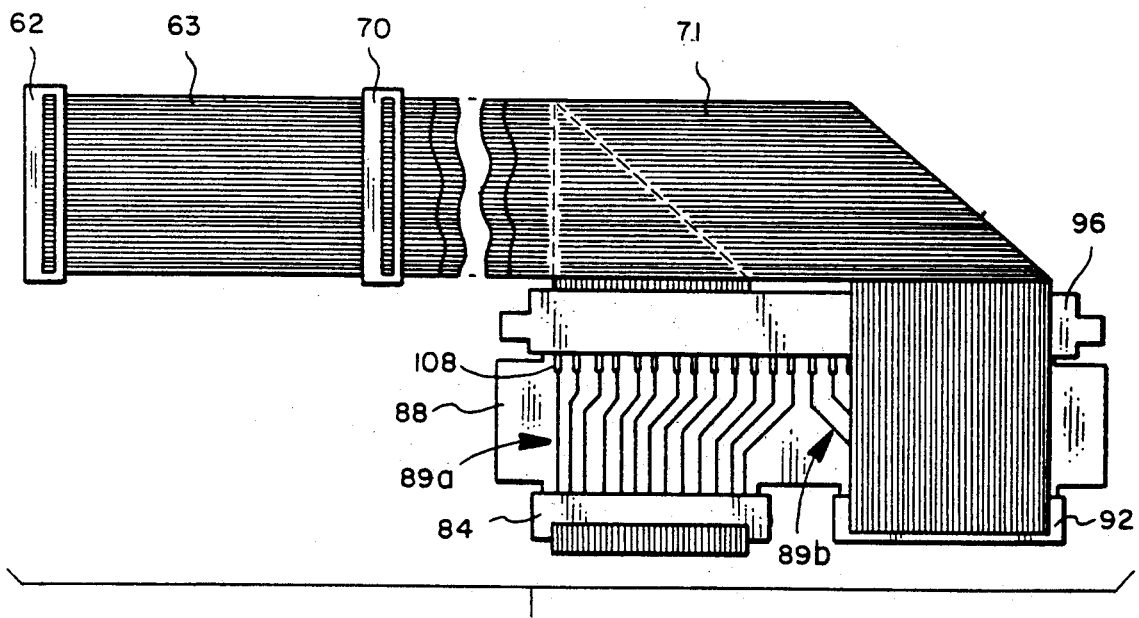
FIG. 3 is a plan view illustrating details of an interconnect, or adapter, card used with the extender board of the present invention.
Figure 6:
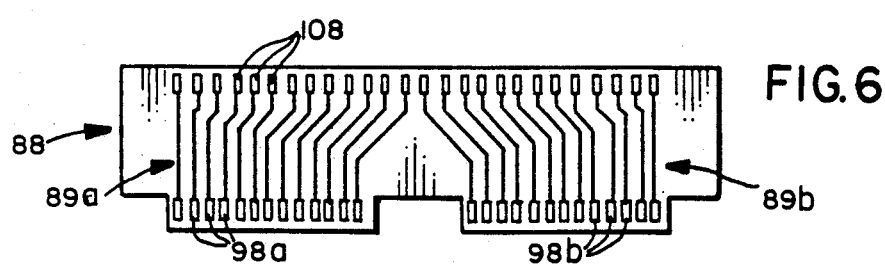
FIG. 6 is a plan view of the interconnect, or adapter, card used with the extender board of the present invention.

Referring to FIG. 3, there are shown details of the arrangement for coupling two of the ribbon cables 63 and 71 to the edge terminals of a circuit board. A plan view of the interconnect card 88 employed in this coupling arrangement is shown in FIG. 6. The aforementioned connectors 84 and 92 are coupled to respective pairs of edge terminals 98a and 98b of the interconnect card 88. The interconnect card 88 not only includes first and second sets of edge terminals 98a, 98b on a first edge thereof, but also a third set of edge terminals 108 on an opposing edge thereof. Each of the first and second sets of edge terminals 98a, 98b is coupled to a respective one of the third set of edge terminals 108 by means of a respective one of the conductors 89a and 89b. The interconnect card 88 may be of conventional design and configuration and include a substrate having a plurality of conductors either in printed circuit or wire form on one or both surfaces thereof. Another interconnect card 86 in combination with a conductor 94 couples ribbon cables 67 and 69 to respective sets of edge terminals 38 on edge 32d of the circuit board as shown in FIG. 2.

The electrical layout of the extender board 34 of the present invention may be produced by well-known techniques. In one such method, a positive of the circuit design is produced. The conductive locations are black and the balance of the design is clear. A negative is then produced. The conductive circuit patterns are the only clear areas on the negative. The negative is then placed over a board and the board is exposed to ultraviolet light. The extender board substrate which is made of insulating material has a cladding of copper laminate. A photoresistive varnish covers the copper cladding. Thus, when the board is exposed to the ultraviolet light through the negative, the exposed areas of the board harden. The unexposed areas of the photoresistive varnish are then washed away and an etching solution is used to remove the copper laminate from the unexposed portions of the board. Another solution is used to remove the hardened photoresistive layer from the exposed portions of the board so as to expose the printed circuit of copper. The extender board is then dried and holes are drilled at appropriate locations, such as where adapters are to be located, as in the case of edge terminals 33 and 33a shown in FIGS. 4 and 5. These holes are plated with an electrical conducting material, such as copper, so that the holes connect to the circuit pattern. This also allows the solder to flow easily through the hole and make a good electrical connection. Terminals on the board edges may be formed at the same time as the printed circuit design. The interconnect, or adapter, boards may be prepared in a similar manner.

Also provided in the present invention is a coupling-/support arrangement 100 for securely attaching the circuit board 32 to the extender board 34 in providing support for the circuit board during testing/troubleshooting. The coupling/support arrangement 100 includes a bracket 102 securely coupled to the extender board 34 by means of a rivet or threaded member 103. Attached to the bracket 102 is a connecting link 104, which is preferably in the form of a hook. A distal end of the connecting link 104 is adapted for insertion through an aperture 106 within the circuit board 32. The connecting link 104 is preferably comprised of strong, semi-rigid material having the strength to support the circuit board 32 which can be manually manipulated for insertion in the circuit board's aperture 106 in securely connecting the circuit board to the extender board 34.

There has thus been shown a multi-edge extender board having a plurality of spaced terminals along adjacent edges thereof which is adapted for coupling a circuit board removed from an equipment rack to the circuitry with which it interfaces in the equipment rack during operation. The extender board allows for complete testing of the thus removed circuit board which may have terminals on two or more adjacent edges as well as on both sides thereof without requiring modification of either the circuit board or the equipment rack in which it is installed. The various edge terminals of the extender board are located in positions corresponding to the positions of associated edge terminals on the circuit board and are coupled via the combination of multi-contact connectors and ribbon cables to the aforementioned circuit board edge terminals to provide operating signals thereto while the circuit board is removed from its in-service position. A connecting arrangement for securely supporting the circuit board on the extender board is also provided.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. For use with a circuit board having first and second adjacent edges with first and second terminal means respectively disposed thereon for coupling said circuit board to circuitry in a support structure in which said circuit board is mounted, apparatus for directly coupling said circuit board to said circuitry with said circuit board removed from said support structure, said apparatus comprising:

a generally planar, rigid substrate having a plurality of edges;

third and fourth terminal means disposed on respective opposed first and second edges of said substrate for coupling the circuitry in the support structure to the circuit board, wherein the apparatus further includes conductive means for electrically coupling said third and fourth terminal means and wherein said third terminal means for coupling to the circuitry in the support structure and said fourth terminal means is for coupling to the first terminal means of the circuit board;

fifth and sixth terminal means respectively disposed on a third edge and on an inner portion of said substrate for coupling the circuitry in the support structure to the circuit board, wherein said third edge is adjacent to the first edge of said substrate and said fifth and sixth terminal means are electrically coupled; and first coupling means for coupling said sixth terminal means to the second terminal means on the circuit board.

2. The apparatus of claim 1 further comprising second coupling means and seventh and eighth terminal means respectively disposed on a fourth edge and on said inner portion of said substrate for coupling the circuitry in the support structure to the circuit board, wherein said fourth edge is adjacent to the first edge of said substrate, and wherein said second coupling means is for coupling said eighth terminal means to terminal means disposed on a third edge of said circuit board disposed adjacent to the first edge thereof.

3. The apparatus of claim 2 wherein said conductive means comprises a plurality of spaced strip conductors electrically coupling respective terminals in said third and fourth terminal means.

4. The apparatus of claim 3 further comprising edge connector means for coupling said fourth terminal means on said substrate to the first terminal means of the circuit board.

5. The apparatus of claim 4 wherein each of said first and second coupling means includes a respective pair of connectors and a multi-conductor flexible cable coupled to said pair of connectors for respectively coupling said sixth terminal means to said second terminal means and said eighth terminal means to said terminal means disposed on a third edge of said circuit board.

6. The apparatus of claim 5 further comprising ninth terminal means disposed on the second edge of said substrate opposite to the first edge thereof, and wherein said ninth terminal means is for coupling to terminal means disposed on a fourth edge of the circuit board opposite to the first edge thereof.

7. The apparatus of claim 1 wherein said substrate has respective first and second sides, and wherein the terminal means disposed on said substrate is disposed on the respective first and second sides thereof.

8. The apparatus of claim 1 further comprising attachment means for securely attaching the circuit board to said substrate.

9. The apparatus of claim 8 wherein said attachment means is disposed adjacent to the second edge of said substrate.

10. The apparatus of claim 9 wherein said attachment means includes in combination a mounting bracket and a hook member.

11. The apparatus of claim 10 wherein said mounting bracket is attached to said substrate adjacent to the second edge thereof and said hook element is for engaging the circuit board adjacent to the first edge thereof.

12. An extender board apparatus for electrically connecting a multi-edged circuit board having a plurality of terminals on first and second edges thereof to a plurality of in-service contact elements, wherein said first and second edges are disposed adjacent to one another on the circuit board, the apparatus comprising:

an insulating board having two sides and first and second opposed edges and a third edge disposed adjacent to said first edge;

a plurality of terminals on each of said first and third edges of the insulating board for electrically connecting the extender board to the plurality of in-service contact elements;

a plurality of terminals on the second edge of said insulating board;

first conductive means on said insulating board for connecting the plurality of terminals on the first edge with the plurality of terminals on the second edge of said insulating board for transmitting electrical current;

second conductive means for connecting the plurality of terminals on the third edge of said insulating board to the plurality of terminals on the second edge of the circuit board for transmitting electrical current; and first connector means for coupling the plurality of terminals on the second edge of the insulating board to the plurality of terminals on the first edge of the circuit board.

13. The apparatus of claim 12 wherein said first conductive means comprises a plurality of conductors.

14. The apparatus of claim 12 wherein said first connector means includes an edge connector.

15. The apparatus of claim 12 further comprising support means connected to the insulating board for supporting the circuit board.

16. The apparatus of claim 15 wherein said support means includes a hook.

17. The apparatus of claim 12 wherein said second conductive means includes a plurality of conductors connected to the plurality of terminals on the third edge of said insulating board.

18. The apparatus of claim 17 further comprising an adapter board having a plurality of top terminals and a plurality of bottom terminals, wherein said top terminals are for connecting the plurality of terminals on the second edge of the circuit board, and a ribbon cable connected between the plurality of bottom terminals and said plurality of conductors.

19. The apparatus of claim 18 further comprising support means connected to said insulating board for supporting the circuit board.

20. The apparatus of claim 19 wherein said support means includes a hook.

21. The apparatus of claim 20 further comprising second connector means for connecting a ribbon cable to said plurality of conductors.

22. The apparatus of claim 21 wherein said second connector means comprises an ejection-type connector.

23. An extender board apparatus for electrically connecting a multi-edged printed circuit board having a plurality of terminals on a rear edge and at least one adjacent edge to the rear edge to a plurality of in-service contact elements, the apparatus comprising:

an insulating board having a back edge, a front edge, two edges adjacent to the back edge, and two sides;

a plurality of terminals on said back edge and at least one of the edges adjacent to the back edge secured to at least one side of the insulating board for electrically connecting the extender board to the plurality of in-service contact elements;

a plurality of terminals on the front edge secured to at least one side of the insulating board;

a first conductive means secured to at least one side of the insulating board connecting the plurality of terminals on the back edge with the plurality of terminals on the front edge for transmitting electrical current;

at least one second conductive means for connecting the plurality of terminals on at least one of the edges adjacent to the back edge with the respective plurality of terminals on at least one adjacent edge of the printed circuit board for transmitting electrical current, a portion of the second conductive means being secured to at least one side of the insulating board; and a first connector on the insulating board for connecting the plurality of terminals on the front edge of the insulating board and the plurality of terminals on the rear edge of the printed circuit board.

24. The apparatus of claim 23 wherein the first conductive means is a first printed circuit pattern.

25. The apparatus of claim 23 wherein the first connector is an edge connector.

26. The apparatus of claim 23 further comprising a supporting means connected to the insulating board for supporting a printed circuit board.

27. The apparatus of claim 26 wherein the supporting means is a hook.

28. The apparatus of claim 24 wherein the portion of the second conductive means secured to the insulating board is a second printed circuit pattern connected to the plurality of terminals on at least one of the edges adjacent to the back edge of the insulating board.

29. The apparatus of claim 28 further comprising an adapter board having a plurality of top terminals and a plurality of bottom terminals, the top terminals are for connecting the plurality of terminals on at least one adjacent edge of the printed circuit board and at least one ribbon cable connected between the plurality of bottom terminals and the second printed circuit pattern.

30. The apparatus of claim 29 wherein the first connector is an edge connector.

31. The apparatus of claim 30 further comprising a supporting means connected to the insulating board for supporting a printed circuit board.

32. The apparatus of claim 31 wherein the supporting means is a hook.

33. The apparatus of claim 29 further comprising at least one second connector for connecting at least one ribbon cable to the second printed circuit pattern.

34. The apparatus of claim 33 wherein the second connector is an ejection type connector.

* * * * *

UNITED STATES PATENT AND TRADEMARK OFFICE
CERTIFICATE OF CORRECTION

PATENT NO. : 5,010,446
DATED : April 23, 1991
INVENTOR(S) : Michael B. Scannell

It is certified that error appears in the above-identified patent and that said Letters Patent is hereby corrected as shown below:

Col. 6 / Line 36: After "board", insert --32--.

Col. 7 / Lines 68: After "means", insert --is--.

Signed and Sealed this

Ninth Day of March, 1993

Attest:

STEPHEN G. KUNIN

Attesting Officer

Acting Commissioner of Patents and Trademarks